US010055526B1

(12) United States Patent
Lewis et al.

(10) Patent No.: US 10,055,526 B1
(45) Date of Patent: Aug. 21, 2018

(54) REGIONAL DESIGN-DEPENDENT VOLTAGE CONTROL AND CLOCKING

(71) Applicant: Intel Corporation, Santa Clara, CA (US)

(72) Inventors: David Michael Lewis, Toronto (CA); Herman Henry Schmit, Palo Alto (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/634,902

(22) Filed: Jun. 27, 2017

(51) Int. Cl.
*G06F 17/50* (2006.01)
*H03K 19/0175* (2006.01)
*H03K 5/159* (2006.01)
*H03K 19/00* (2006.01)
*H03K 5/00* (2006.01)

(52) U.S. Cl.
CPC ...... *G06F 17/5054* (2013.01); *G06F 17/5027* (2013.01); *H03K 5/159* (2013.01); *H03K 19/0016* (2013.01); *H03K 19/017581* (2013.01); *H03K 2005/00019* (2013.01)

(58) Field of Classification Search
CPC ............ G06F 17/5027; G06F 17/5045; G06F 17/5054; H03K 19/0016; H03K 19/017581

USPC .................................. 326/37–41, 47; 716/10
See application file for complete search history.

(56) References Cited

U.S. PATENT DOCUMENTS

| 8,375,345 | B1* | 2/2013 | Barowski | G06F 17/5045 716/104 |
| 9,496,871 | B1* | 11/2016 | Devlin | H03K 19/0016 |
| 2012/0131530 | A1* | 5/2012 | Moffitt | G06F 17/5027 716/113 |
| 2015/0032278 | A1* | 1/2015 | Bhageria | H02J 4/00 700/295 |
| 2017/0161075 | A1* | 6/2017 | Titov | G06F 9/38 |

* cited by examiner

*Primary Examiner* — Jason M Crawford
(74) *Attorney, Agent, or Firm* — Fletcher Yoder, P.C.

(57) ABSTRACT

An integrated circuit include multiple regions, wherein at least one region includes a control circuit. The control circuit receives a target voltage value to supply to the region that enables the region to operate at a target speed. The control circuit also receives a first criticality value of a first path of a design programmed in the region. The first criticality value is based on a first propagation time of the first path and a first allowable time to traverse the first path while enabling the region to operate at the target speed. The control circuit further instructs a power regulator to supply voltage to the region based at least in part on the target voltage value and the first criticality value. The integrated circuit also includes the power regulator communicatively coupled to the at least one region. The power regulator supplies power to the at least one region.

20 Claims, 6 Drawing Sheets

REGIONAL DESIGN-DEPENDENT VOLTAGE CONTROL AND CLOCKING

BACKGROUND

This disclosure relates to improving power consumption in a region of programmable logic of an integrated circuit while providing sufficient clock frequency to the region to support a design programmed into the region of the programmable logic.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

In certain integrated circuits that do not contain programmable logic fabric, minimum operating voltages or clock frequencies may be identified by testing the integrated circuits during the manufacturing process. An integrated circuit that contains programmable logic fabric, however, provides a highly flexible platform that can be configured after manufacturing with a custom circuit design. The flexibility and variability in the possible designs that may be programmed into this type of integrated circuit, however, also makes identifying the lowest potential operating voltages or clock frequencies during much more difficult—potentially even impossible—since there may be no way of knowing during manufacturing what circuit design will be ultimately programmed into the programmable logic fabric of the integrated circuit.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure relates generally to improving power consumption in an integrated circuit and, more particularly, to reducing power consumption in certain regions of the integrated circuit based on a design programmed in the integrated circuit, while still providing sufficient operating voltage and/or clock frequency to operate the integrated circuit. Each region may include a control unit or circuit, a non-volatile memory device, and a random-access memory device. The non-volatile memory device may store a target voltage value that, when supplied to the region, enables the region to operate approximately at or above a target speed. The random-access memory device may store a criticality value based on the design that still enables the region to operate approximately at or above the target speed. Specifically, the criticality value is based on a propagation time of a path of the design in the region and an allowable time to traverse the path that still enables the region to operate approximately at or above the target speed. The control circuit outputs a signal to a power regulator based on the target voltage value and the criticality value (e.g., to further reduce the voltage provided to the region).

In some embodiments, the random access memory device may store multiple criticality values based on multiple paths of the design that still enable the region to operate approximately at or above the target speed. In such embodiments, the control circuit may output multiple control signals to multiple power regulators based on the target voltage value and the multiple criticality values. Additionally, the disclosure includes adjusting clocking in a region to compensate for clock delays resulting from reducing voltage to the region.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

An integrated circuit consumes power when in operation, such as when implementing a design programmed in the integrated circuit. By consuming less power, the integrated circuit will be less expensive to operate. Moreover, less power consumption results in less heat dissipated, enabling the integrated circuit to operate at a cooler temperature. As a result, manufacturers may include more components on the integrated circuit and/or more tightly pack components on the integrated circuit. Furthermore, cooler operating temperatures increase the lifetime of the integrated circuit. Additionally, in cases where the power source of the integrated circuit is a battery, lower power consumption translates to longer battery life and/or smaller footprint of the battery (e.g., on a printed circuit board).

Voltage identification techniques may be used to reduce power consumed by an integrated circuit. For example, an integrated circuit may be tested, and one or more target (e.g., reduced or minimum) voltage values may be determined that enable the integrated circuit to operate at one or more target (e.g., minimum) speeds. A target voltage value may be stored in a memory device of the integrated circuit such that a power regulator may supply a respective target voltage to operate approximately at or above a respective target speed.

More recently, an integrated circuit may be divided into multiple regions to enable design re-use and/or reduce runtime of the design. Because each region may include different components, different routing, or simply fluctuations that cause each region to operate differently, each region may use a different target voltage to operate approximately at or above the target speed. Each region may thus include a respective memory device that stores one or more target voltage values to enable the region to operate approximately at or above the one or more target speeds.

A design for the integrated circuit includes one or more routed paths (e.g., circuit paths that connect components of the integrated circuit together using connective components such as wires) in the integrated circuit. Each path may be located in one or more regions of the integrated circuit. A traverse time for traversing a path (e.g., at a nominal voltage) may be determined. Additionally, an allowable (e.g., maximum) propagation time to traverse the path that still enables each region that includes the path to approximately meet a target speed may also be determined. In some cases, the propagation time is less than the allowable time. In such cases, power consumption could be further reduced in a respective region that includes the path, resulting in the propagation time to approach (but not exceed) the allowable time, while still enabling the respective region to approximately meet the target speed.

Techniques for improving power consumption in an integrated circuit and, more particularly, to reducing power consumption in each region of the integrated circuit based on a design programmed in the integrated circuit while providing sufficient speed to operate the integrated circuit. By storing a criticality value based on a path of the design in the region, a regional control unit or circuit of the integrated circuit may control a power regulator to reduce voltage provided to the region. In particular, the criticality value may be based on a propagation time of the path and an allowable time to traverse the path that still enables the region to operate approximately at or above the target speed. Moreover, the regional control circuit may control multiple power regulators based on multiple criticality values of multiple paths, enabling the regional control un circuit it to further reduce voltage provided to the region. Additionally, the regional control circuit may adjust clocking in the region to compensate for clock delays that result from reducing voltage to the region.

Figure 1:
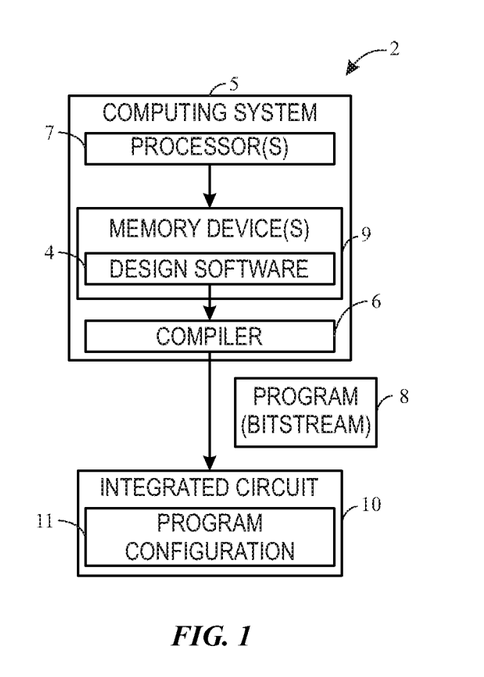
FIG. 1 illustrates a block diagram of a system that may reduce power consumption in each region of an integrated circuit based on a design programmed in the integrated circuit while providing sufficient speed to operate the integrated circuit, in accordance with an embodiment of the present disclosure.

With the foregoing in mind, FIG. 1 illustrates a block diagram of a system 2 that may reduce power consumption in each region of an integrated circuit 10 based on a design programmed in the integrated circuit 10 while providing sufficient speed to operate the integrated circuit 10, in accordance with an embodiment of the present disclosure. The integrated circuit 10 may be reconfigurable (e.g., a field programmable gate array (FPGA)). A user may implement a circuit design to be programmed onto the integrated circuit 10 using design software 4, such as a version of Quartus by Altera™.

The design software 4 may be executed by one or more processors 7 of a computing system 5. The computing system 5 may include any suitable device capable of executing the design software 4, such as a desktop computer, a laptop, a mobile electronic device, a server, and the like. The computing system 5 may access, configure, and/or communicate with the integrated circuit 10. The processor(s) 7 may include multiple microprocessors, one or more other integrated circuits (e.g., application specific integrated circuits, field programmable gate arrays, reduced instruction set processors, and the like), or some combination thereof.

One or more memory devices 9 may store the design software 4. In addition, the memory device(s) 9 may store information related to the integrated circuit 10, such as control software, configuration software, look up tables, configuration data, etc. In some embodiments, the processor(s) 7 and/or the memory device(s) 9 may be external to the computing system 5. The memory device(s) 9 may include a tangible, non-transitory, machine-readable-medium, such as a volatile memory (e.g., a random access memory (RAM)) and/or a nonvolatile memory (e.g., a read-only memory (ROM)). The memory device(s) 9 may store a variety of information and be used for various purposes. For example, the memory device(s) 9 may store machine-readable and/or processor-executable instructions (e.g., firmware or software) for the processor(s) 7 to execute, such as instructions to determine a speed of the integrated circuit 10 or a region of the integrated circuit 10, determine a criticality of a path of a design programmed in the integrated circuit 10 or a region of the integrated circuit 10, programming the design in the integrated circuit 10 or a region of the integrated circuit 10, and the like. The memory device(s) 9 may include one or more storage devices (e.g., nonvolatile storage devices) that may include read-only memory (ROM), flash memory, a hard drive, or any other suitable optical, magnetic, or solid-state storage medium, or any combination thereof.

The design software 4 may use a compiler 6 to generate a low-level circuit-design program 8 (bitstream), sometimes known as a program object file, which programs the integrated circuit 10. That is, the compiler 6 may provide machine-readable instructions representative of the circuit design to the integrated circuit 10. For example, the integrated circuit 10 may receive one or more programs 8

(bitstreams) that describe the hardware implementations that should be stored in the integrated circuit 10. The programs 8 (bitstreams) may programmed into the integrated circuit 10 as a configuration program 11.

Figure 2:
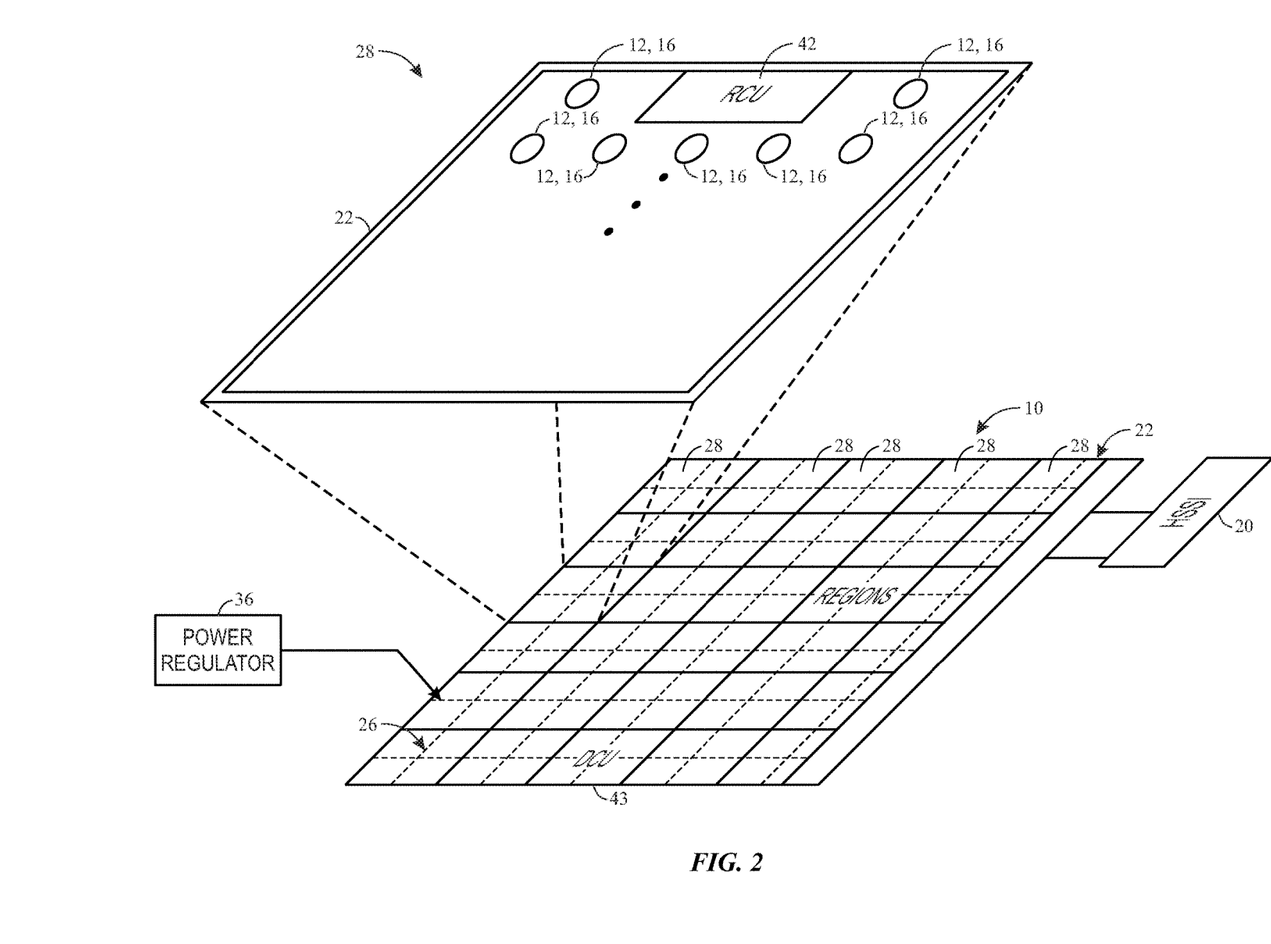
FIG. 2 is a diagram of a system that includes an integrated circuit, in accordance with an embodiment of the present disclosure.

FIG. 2 is a diagram of a system 8 that illustrates regions 28 of the integrated circuit 10 of FIG. 1, in accordance with an embodiment of the present disclosure. As illustrated, the integrated circuit 10 is a programmable circuit, such as a field programmable gate array device. In alternative embodiments, the integrated circuit 10 may be an application-specific integrated circuit, an application-specific standard part, a System-on-Chip, and the like. The system 8 may be used in any suitable application, such as a data center, network device, server, router, switch, gateway, firewall, bridge, hub, database, workstation, desktop computer, laptop computer, mobile device, wireless access point, wireless access device, and the like.

Interconnection resources 22 may be used to route signals, such as clock or data signals, through the integrated circuit 10. The integrated circuit 10 of FIG. 2 is a sectorized FPGA of the type described in U.S. Application No. 20160049941, "Programmable Circuit Having Multiple Sectors," which is incorporated by reference in its entirety for all purposes. As such programmable logic resources of the integrated circuit may be distributed through a number of discrete programmable logic sectors or regions 28. Each programmable logic region 28 may include a number of programmable logic elements 12 having operations defined by configuration memory 16 (e.g., configuration random access memory). The programmable logic elements 12 may include combinational or sequential logic circuitry. For example, the programmable logic elements 12 may include look-up tables, registers, multiplexers, routing wires, and so forth. A user may program the programmable logic elements 12 to perform a variety of desired functions. A power or voltage regulator 36 (including a power supply) may provide a source of voltage and current to a power distribution network (PDN) 26 that distributes electrical power to the various components of the integrated circuit 10. Operating the circuitry of the integrated circuit 10 causes power to be drawn from the power distribution network 26. The integrated circuit 10 may include transceiver circuitry 20 (e.g., high speed serial interface circuitry) for driving signals off of the integrated circuit 10 and for receiving signals from other devices.

There may be any suitable number of programmable logic regions 28 on the integrated circuit 10. Indeed, while 29 programmable logic regions 28 are shown in FIG. 2, it should be appreciated that more or fewer may appear in an actual implementation (e.g., in some cases, on the order of 50 to 100 regions or more). Each programmable logic regions 28 may include a regional or sector control unit or circuit (RCU) 42 that controls the operation of the programmable logic sector 28. In some embodiments, the regional control circuit 42 may be implemented in software and/or hardware, or any other suitable form. Each regional control circuit 42 may be in communication with a device control unit or circuit (DCU) 43. In some embodiments, the device control circuit 43 may be implemented in software and/or hardware, or any other suitable form. Each regional control circuit 42 may accept commands and data from the device control circuit 43, and may read data from and write data into its configuration memory 16 based on control signals from the device control circuit 43. In addition to these operations, the regional control circuit 42 may be augmented with numerous additional capabilities. For example, such capabilities may include locally sequencing reads and writes to implement error detection and correction on the configuration memory 16 and sequencing test control signals to effect various test modes.

The regional control circuits 42 and the device control circuit 43 may be implemented as logic circuits, such as state machines and/or processors. For example, each operation of the regional control circuits 42 or the device control circuit 43 may be implemented as a separate routine in a memory containing a control program. This control program memory may be fixed in a read-only memory (ROM) or stored in a writable memory, such as random access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic regions 28. This may provide usable extensibility in an efficient and easily understood way. This may be useful because new commands could bring about large amounts of local activity within the region at the expense of only a small amount of communication between the device control circuit 43 and the regional control circuits 42.

Each regional control circuit 42 thus may communicate with the device control circuit 43, which may coordinate the operations of the regional control circuits 42 and convey commands initiated from outside the integrated circuit 10. To support this communication, the interconnection resources 22 may act as a network between the device control circuit 43 and each regional control circuit 42. The interconnection resources 22 may support a wide variety of signals between the device control circuit 43 and each regional control circuit 42. In one example, these signals may be transmitted as communication packets.

The integrated circuit 10 may be electrically programmed. With electrical programming arrangements, the programmable elements 12 may include one or more logic elements (wires, gates, registers, etc.). For example, during programming, configuration data is loaded into the configuration memory 52 using pins and/or input/output circuitry (e.g., of the transceiver circuitry 20) of the integrated circuit 10. In one example, the configuration memory 16 may be implemented as configuration random-access-memory cells. The use of configuration memory 16 based on RAM technology is described herein is intended to be only one example. Moreover, configuration memory 16 may be distributed (e.g., as RAM cells) throughout the various programmable logic regions 28 the integrated circuit 10. The configuration memory 16 may provide a corresponding static control output signal that controls the state of an associated programmable logic element 12 or programmable component of the interconnection resources 22. The output signals of the configuration memory 16 may configure the may be applied to the gates of metal-oxide-semiconductor (MOS) transistors that control the states of the programmable logic elements 12 or programmable components of the interconnection resources 22.

Figure 3:
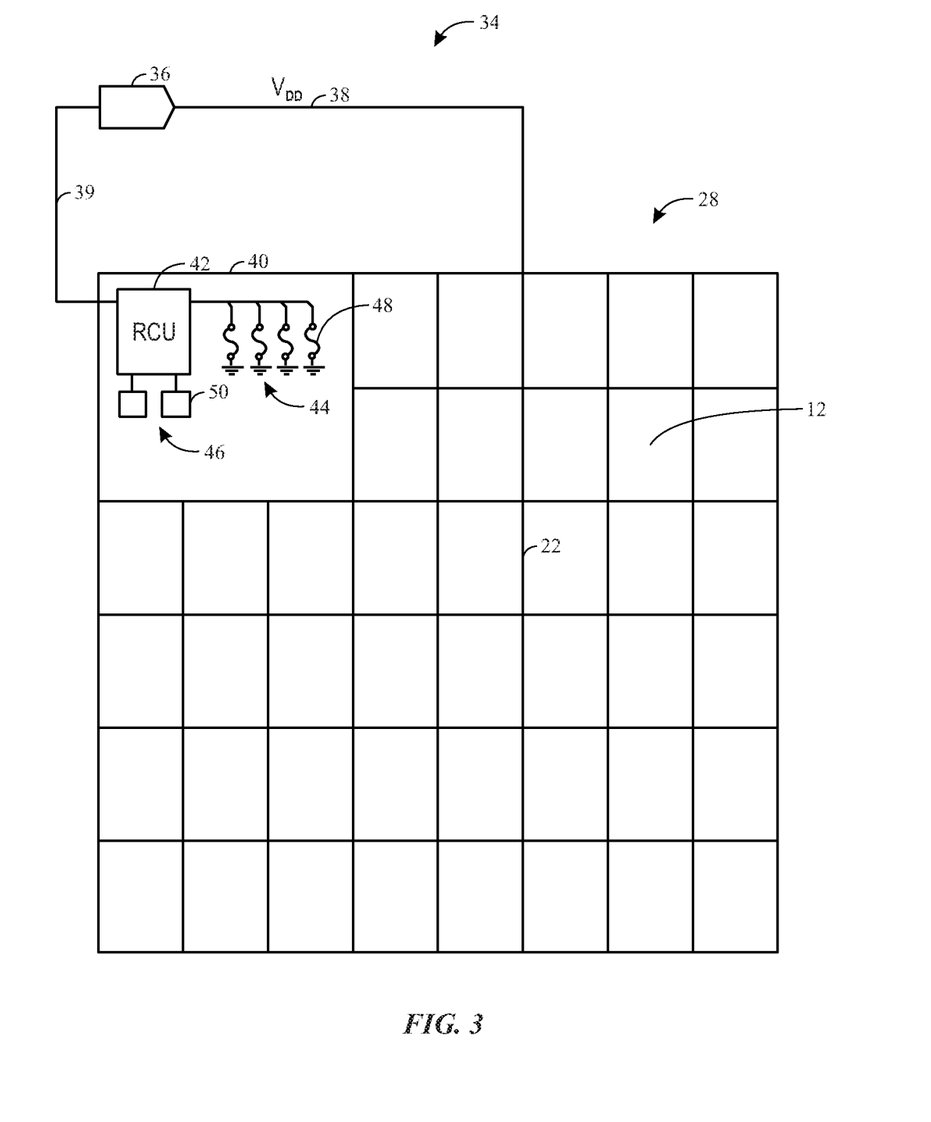
FIG. 3 is a diagram of a system that includes a region of the integrated circuit of FIG. 2 and stores one or more target voltage values associated with one or more target speeds of the region, in accordance with an embodiment of the present disclosure.

With this in mind, FIG. 3 is a diagram of a system 34 that includes a region (e.g., 28) of the integrated circuit 10 of FIG. 2 and stores one or more target (e.g., reduced or minimum) voltage values associated with one or more target speeds of the region 28, in accordance with an embodiment of the present disclosure. The system 34 also includes a power regulator 36 communicatively coupled to the regional control circuit 42 that supplies a voltage (e.g., $V_{DD}$) 38 to the region 28. While the power regulator 36 is illustrated as part of the region 28 in FIG. 3, it should be understood that the present disclosure also contemplates the power regulator 36 external to the region 28 (e.g., while still on the integrated circuit 10) or even external to the integrated circuit 10. Moreover, it should be understood that the present disclosure contemplates any suitable number of power regulators 36 share among any suitable number of regions (e.g., 28). For example, multiple power regulators 36 may supply the voltage $V_{DD}$ 38 to the region 28. As another example, a single power regulator 36 may supply multiple voltages (including $V_{DD}$ 38) to multiple regions (including 28). The region may include a control block 40, which includes the regional control circuit 42. The regional control circuit 42 may send a signal 39 (e.g., a control signal) to the power regulator 36 to control (e.g., adjust) the voltage $V_{DD}$ 38 that is supplied to the region 28.

The region 28 may include multiple programmable logic elements 12. The region 28 may also include a non-volatile memory device 44 and a random access memory device 46, each communicatively coupled to the regional control circuit 42. The non-volatile memory device 44 may store one or more target voltage values associated with one or more target speeds of the region 28. In particular, each region (e.g., 28) of the integrated circuit 10 may be tested, and target (e.g., reduced or minimum) voltage values may be determined that enable the region 28 to operate at one or more target (e.g., minimum) speeds. The target voltage values may be lower than a maximum voltage that may be supplied to the region 28. In some embodiments, the target voltage values and/or the one or more target speeds may be specified by an integrated circuit device or system manufacturer. For example, when supplied with a nominal voltage, the region 28 may operate at a speed 10% faster than a target speed. The nominal voltage may be a voltage (e.g., an ideal voltage) that is determined to result in the region 28 operating approximately at or above the target speed. As such, if delay is proportional to voltage, then the voltage may be reduced to a factor of 1/1.1=0.909 using voltage identification techniques before executing a design programmed in the region 28 (e.g., at build-time of the integrated circuit 10, during power up or startup of the region 28, and the like) to reduce power consumed by the region 28 when supplied to the region 28 while still enabling the region 28 to operate approximately at or above the target speed. It should be understood that any suitable values may be stored in the non-volatile memory device 44 instead of the target voltage value. For example, voltage adjustment values (e.g., voltage differences), voltage ratio or percentage values, adjustment or ratio values that relate to delay time in the region 28, delay adjustment or ratio values that relate to speed of the region 28, and the like, that result in the power regulator 36 applying the target voltage value to the region 28, are contemplated.

In some embodiments, the non-volatile memory device 44 may include one or more one-time programmable fuses (e.g., 48) that store the target voltage value. In some embodiments, the non-volatile memory device 44 may store multiple target voltage values that correspond to the operating the region 28 at multiple target (e.g., minimum) speeds. Because each region (e.g., 28) may include different numbers and/or types of resources, different routing, or simply fluctuations that cause each region to operate differently, each region may use different target voltages to operate approximately at or above a certain target speed. In additional or alternative embodiments, any other suitable memory component or device may be used to store the target voltage value, such as a programmable read only memory device.

The random access memory device 46 may store a criticality value based on a design programmed in the region 28 that still enables the region 28 to operate approximately at or above one or more target speeds. In some embodiments, the criticality value may be based on a propagation time (e.g., at the nominal voltage) of a path of the design in the region 28 and an allowable time to traverse the path that still enables the region 28 to operate approximately at or above the target speed. The nominal voltage may be a voltage (e.g., an ideal voltage) that is determined to result in the region 28 operating approximately at or above the target speed. For example, the design software 4 may determine the nominal voltage and program the nominal voltage in the integrated circuit 10 via a program 8 (bitstream). A path may include a circuit path in the region 28 that connects components (including the programmable logic elements 12) of the region 28 together using connective components (e.g., the interconnection resources 22), such as wires. For example, the design software 4 may determine that the design includes a path in the region 28 that has a propagation time of 450 picoseconds and program the propagation time in the integrated circuit 10 via a program 8 (bitstream). Based on a target (e.g., minimum) speed for the region 28 to operate, the device control circuit 43 may determine that the allowable time to traverse the path is 500 picoseconds. In some embodiments, the design software 4 may determine the allowable time to traverse the path and program the allowable time in the integrated circuit 10 via a program 8 (bitstream).

As such, the regional control circuit 42 may send the control signal 39 to the power regulator 36 to supply a voltage $V_{DD}$ 38 that delays traversing the path described above by a difference between the allowable time to traverse the path and the propagation time of the path (e.g., 50 picoseconds) or less. For example, the design software 4 may determine a criticality value of the path based on dividing the propagation time of the path by the allowable time of the path and program the criticality value of the path in the integrated circuit 10 via a program 8 (bitstream). In the above example, the design software 4 may determine the criticality value of the path is 0.9 (i.e., 450 picoseconds divided by 500 picoseconds).

As such, the design software 4 may determine that the voltage $V_{DD}$ 38 to the region 28 may be reduced based on the criticality value. In the above example, because the propagation time is 450 picoseconds and the allowable time to traverse the path is 500 picoseconds, the propagation time may be increased (e.g., delayed) by a factor of 1.111 (i.e., 500 picoseconds divided by 450 picoseconds) or less and still not exceed the allowable time to traverse the path. Because the delay may be inversely proportional to the supply voltage $V_{DD}$ 38, the voltage supply voltage $V_{DD}$ 38 may be adjusted by a factor of 0.9 (i.e., 1 divided by 1.111) or more, which is the criticality value of the path, thus reducing the power consumed in the region 28 by approximately 20% or less, (since power generally corresponds to the square of the supply voltage), while still not exceeding the allowable time to traverse the path, enabling the region 28 to still approximately meet the target speed. In various embodiments, the design software 4 may store a number of volts, a percentage, a ratio, and the like, based on the criticality value, and/or the criticality value itself, to reduce the voltage $V_{DD}$ 38 supplied to the region 28, in the integrated circuit 10 via a program 8 (bitstream). In some embodiments, because the delay may not vary exactly inversely with the supply voltage $V_{DD}$ 38, the regional control circuit 42 and programming may be designed to mirror or approximate the exact dependency.

The regional control circuit 42 may send the control signal 39 to the power regulator 36 based on the criticality value stored in the random access memory device 46 and the target voltage value stored in the non-volatile memory device 44, reducing power consumption of the region 28 based on both the design programmed in the region 28 and the speed of the region 28, while still approximately meeting the target speed. In some embodiments, the control signal 39 may be based on the product of the criticality value and the reduced voltage value. For example, the criticality value of a design in the region 28 may be 0.9 and the reduced voltage value for the region 28 may be 90% of the nominal voltage. As such, the regional control circuit 42 may send the control signal 39 that instructs the power regulator 36 to adjust the voltage $V_{DD}$ 38 supplied to the region 28 to 81% (i.e., the product of the 0.9 criticality value and the reduced voltage value that is 90% of the nominal voltage) or more of the nominal voltage. The information included in memory device 46 may include other design-dependent factors that may affect the voltage $V_{DD}$ 38, such as operational temperatures. Another factor that might be included is a maximum current consumption of the region 28, because lower current consumption may reduce a voltage margin that accommodates for resistive voltage drop in power distribution on the integrated circuit 10.

In this manner, power consumption of the region 28 may be reduced beyond that which is determined based on the speed of the region 28 without considering the design in the region 28, while still approximately meeting a target speed of the region 28. In some embodiments, the random access memory device 46 may include one or more configuration random access memory bits (e.g., 50) that store the criticality value. In additional or alternative embodiments, any suitable memory device may be used, such as a dynamic random access memory device. It should be noted that the non-volatile memory device 44 and the random access memory device 46 may be provided in any suitable arrangement, including more memory devices or a single memory device configured to store both the reduced voltage value and the criticality value.

In some cases, the design programmed in the region 28 includes multiple paths that each includes a respective propagation time and allowable time. To approximately meet a target speed of the region 28, the delay applied to the region 28 may be based on the path with the highest criticality value in that region. That is, if the region 28 is programmed with a design that includes two paths, the design software 4 determine two criticality values associated with each path of the two paths. For example, the design software 4 may determine that a first path has a criticality value of 0.8 and a second path has a criticality value of 0.9. The design software 4 may store the criticality values in the random access memory device 46 via a program 8 (bitstream). As such, the regional control circuit 42 may send the control signal 39 to the power regulator 36 based on the criticality value of second path (i.e., 0.9) stored in the random access memory device 46 and the reduced voltage value stored in the non-volatile memory device 44. For example, the control signal 39 may instruct the power regulator 36 to reduce the voltage $V_{DD}$ 38 by 10%. This voltage reduction still enables both paths to meet their respective allowable times while still approximately meeting the target speed of the region 28. However, if the regional control circuit 42 sent a control signal 39 based on the criticality value of the first path (i.e., 0.8) and the reduced voltage value, the voltage $V_{DD}$ 38 would be reduced by 20%, and the second path would no longer meet its allowable time (i.e., it would exceed the allowable time by 12.5%), and thus the region 28 would not meet its target speed.

As such, the regional control circuit 42 may send the control signal 39 to adjust the voltage $V_{DD}$ 38 based on contents of the non-volatile memory device 44 and/or the random access memory device 46. In some embodiments, the regional control circuit 42 may use additional parameters to adjust the voltage $V_{DD}$ 38, such as parameters related to a temperature of the integrated circuit 10, an age of the integrated circuit 10, an operating lifetime of the integrated circuit 10, and the like.

Figure 4:
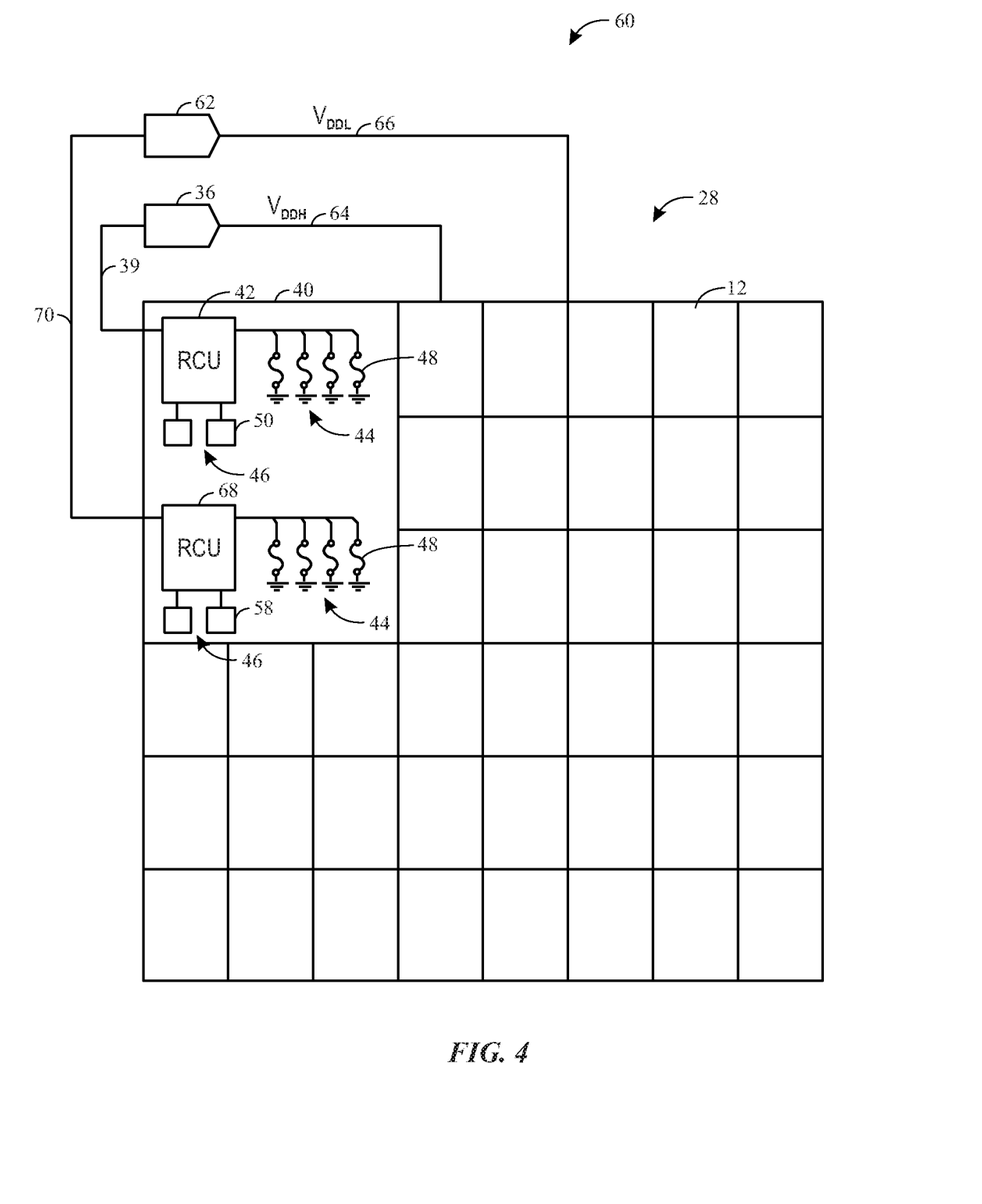
FIG. 4 is a diagram of a system that includes a region of the integrated circuit of FIG. 2 that includes multiple power regulators and stores one or more target voltage values associated with one or more target speeds of the region, in accordance with an embodiment of the present disclosure.

FIG. 4 is a diagram of a system 60 that includes a region (e.g., 28) of the integrated circuit 10 of FIG. 2 that includes multiple power regulators 36, 62 and stores one or more reduced voltage values associated with one or more target speeds of the region 28, in accordance with an embodiment of the present disclosure. While only two power regulators 36, 62 are illustrated, it should be understood that any suitable number of power regulators are contemplated. The power regulators 36, 62 may each supply a respective voltage, $V_{DDH}$ 64 and $V_{DDL}$ 66, to the region 28. As illustrated, the system 60 includes two regional control circuits 42, 68 that may each send a respective control signal 39, 70 to control the two power regulators 36, 62. While a regional control circuit is illustrated for each power regulator 36, 62, it should be understood that any suitable number of regional control circuits are contemplated. In some embodiments, a single regional control circuit may send multiple control signals (e.g., 39, 70) to control multiple power regulators (e.g., 36, 62). Moreover, while each regional control circuit 42, 68 is illustrated to be coupled to a respective non-volatile memory device 44 and random access memory device 46, there may be any suitable number of sets of the non-volatile memory devices 44 and random access memory devices 46. In some embodiments a single regional control circuit may be coupled to a single non-volatile memory device 44 that may store the reduced voltage of the region 28 and a single random access memory device 46 that stores criticality values of each path of the design programmed in the region 28.

In cases where the design programmed in the region 28 includes multiple paths, the design software 4 may determine the criticality values for each path and store the criticality values in a random access memory device 46 via a program 8 (bitstream). The first regional control circuit 42 may then send a first control signal 39 to a first power regulator 36 based on the criticality value of a first path stored in a coupled random access memory device 46, and a second regional control circuit 68 may send a second control signal 70 to a second power regulator 62 based on the criticality value of a second path stored in a coupled random access memory device 46. For example, if the criticality value of the first path is 0.9 and the criticality value of the second path is 0.8, the first regional control circuit 42 may send the first control signal 39 to the first power regulator 36 to reduce the voltage $V_{DDH}$ 64 supplied to the first path by 10%, and the second regional control circuit 68 may send the second control signal 70 to the second power regulator 62 to reduce the voltage $V_{DDL}$ 66 supplied to the second path by 20%. In this manner, power consumption of the region 28 may be reduced even further by tailoring voltage supplied by multiple power regulators 36, 62 to multiple paths of the design programmed in the region 28.

A variety of techniques may be used (as determined by the design software 4) to determine adjusting the voltages $V_{DDH}$ 64 and $V_{DDL}$ 66 supplied to the region 28. In some embodiments, at least some of the regional control circuits (e.g., 42, 68) may send at least some respective control signals (e.g., 39, 70) based on a fixed delay ratio, percentage, amount, and the like. The fixed delay ratio may be a ratio that is applied (e.g., multiplied by) the propagation time at the nominal voltage of a path of the design programmed in the region 28. The fixed delay ratio may be determined by the design software 4. In some embodiments, the fixed delay ratio may be determined as a delay ratio that is likely to, when applied, enable a suitable number or percentage of paths (e.g., approximately 50%, 33%, 25%, and the like) of a design to not exceed their respective allowable times when traversed. The regional control circuit 42 may thus send a respective control signal 70 that adjusts a respective supply voltage (e.g., $V_{DDL}$ 66) based on the fixed delay ratio. For example, the regional control circuit 68 may instruct the power regulator 62 to supply a voltage $V_{DDL}$ 66 equal to the reduced voltage stored in the non-volatile memory device 44 (e.g., coupled to the regional control circuit 68) divided by the fixed delay ratio.

As applied to a design programmed in the region 28 with multiple paths, in one embodiment, the first regional control circuit 42 may send the first control signal 39 to the first power regulator 36 to supply a first (e.g., higher) voltage (e.g., $V_{DDH}$ 64) to the region 28 based on the highest criticality value of the paths in the design, while the second regional control circuit 68 may send the second control signal 70 to the second power regulator 62 to supply a second (e.g., lower) voltage (e.g., $V_{DDL}$ 66) to the region 28 based on a fixed delay ratio. In this embodiment, a path with a criticality that may cause the path to exceed its allowable time when using the lower supply voltage $V_{DDL}$ 66 may use the higher supply voltage $V_{DDH}$ 64 instead. For example, the fixed delay ratio may be 1.1 (e.g., corresponding to reducing a supply voltage $V_{DDL}$ 66 to 90% of the reduced or nominal voltage), while the higher supply voltage $V_{DDH}$ 64 may equal 95% of the reduced or nominal voltage. In additional or alternative embodiments, multiple regional control circuits may send respective control signals to respective power regulators based on multiple fixed delay ratios. In this manner, power consumption of the region 28 may be reduced by providing one or more fixed delay ratio cutoffs to reduce voltage supplied to multiple paths of the design programmed in the region 28.

Figure 5:
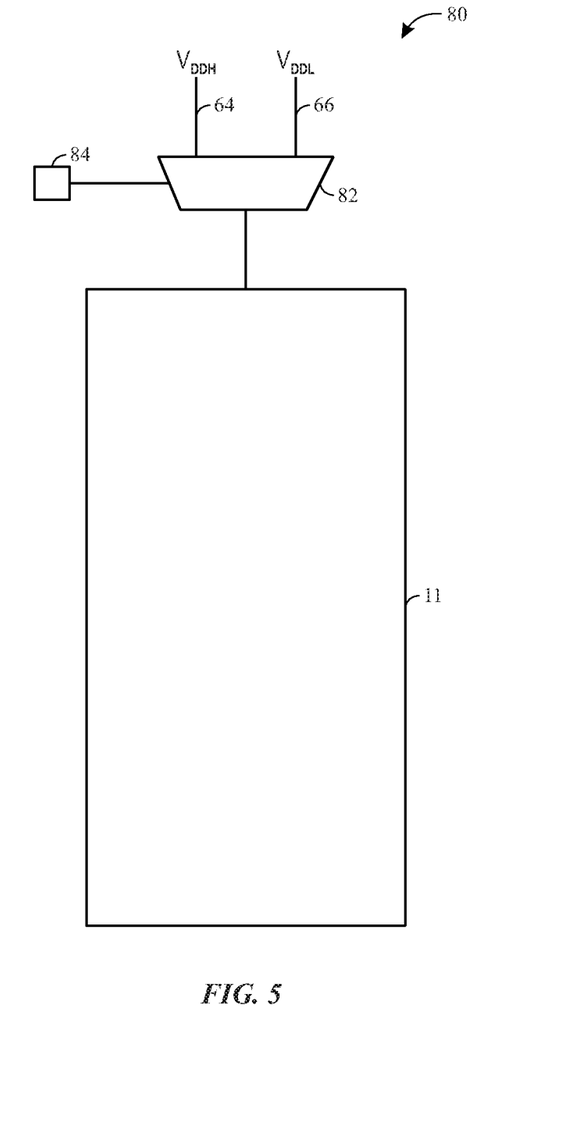
FIG. 5 is a diagram of a system that provides multiple voltages to a logic block of the region of FIG. 4, in accordance with an embodiment of the present disclosure.

FIG. 5 is a diagram of a system 80 that provides multiple supply voltages, $V_{DDH}$ 64 and $V_{DDL}$ 66, to a logic block 11 of the region 28 of FIG. 4, in accordance with an embodiment of the present disclosure. The system 80 may include a multiplexer 82 that receives the multiple supply voltages, $V_{DDH}$ 64 and $V_{DDL}$ 66, and a select signal 84. The select signal 84 may be provided by the regional control circuits 42, 68. As such, the regional control circuits 42, 68 may control the voltage, $V_{DDH}$ 64 or $V_{DDL}$ 66, supplied to the logic block 11. While the multiplexer 82 is illustrated to select between two voltages, $V_{DDH}$ 64 or $V_{DDL}$ 66, it should be understood that the multiplexer 82 may select from any suitable number of voltages.

A number of clock signals may be distributed across at least a portion of the integrated circuit 10, for example, via a clock tree that spans multiple regions. Typically, clock skew may arise in a clock signal due to difference in delay in different parts of the clock tree. Supplying the region 28 with the reduced voltage stored in the non-volatile memory device 44 instead of a nominal voltage may tend to reduce clock skew in the region 28 because it may make certain delays (e.g., of paths of the design programmed in the region 28) similar. As such, delay variation across the region 28, and thus across the integrated circuit 10, may be reduced. However, basing the voltage supplied to each region on a respective design programmed in the region may tend to increase clock skew in the integrated circuit 10 because delay across the integrated circuit 10 may vary according to criticality of the designs.

Figure 6:
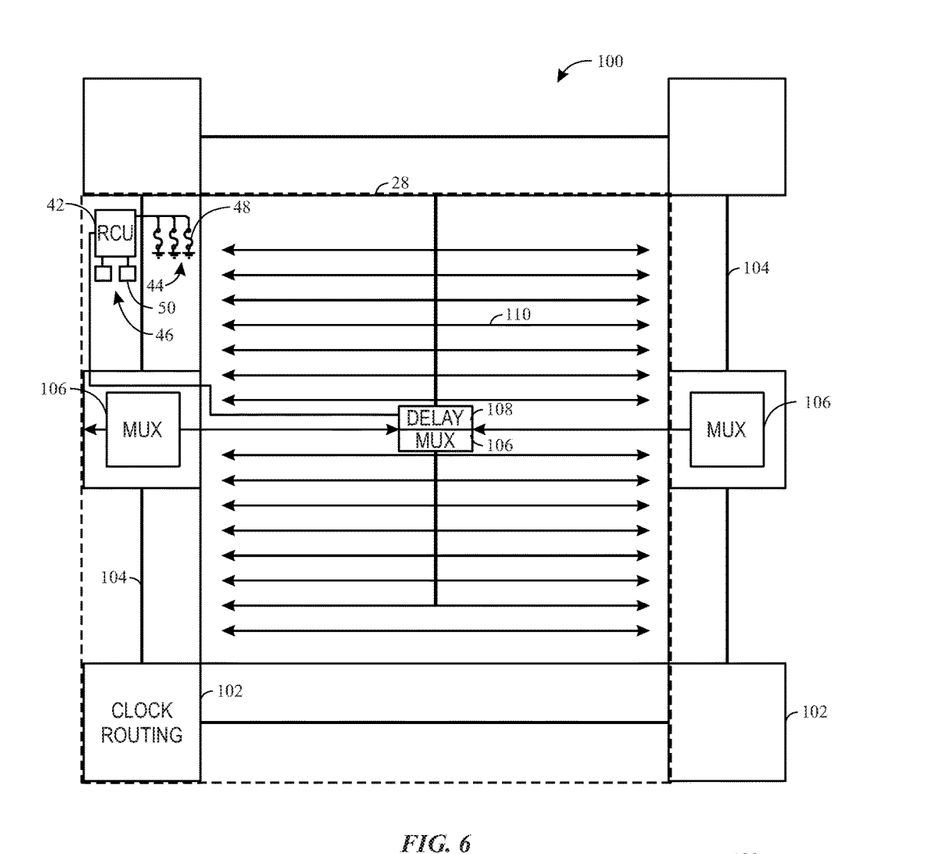
FIG. 6 is a diagram of an example programmable clock routing system in a region of the integrated circuit of FIG. 2 used to reduce clock skew in the integrated circuit caused by reducing supply voltage to the region, in accordance with an embodiment of the present disclosure.

With this in mind, FIG. 6 is a diagram of an example programmable clock routing system 100 in a region (e.g., 28) of the integrated circuit 10 of FIG. 2 used to reduce clock skew in the integrated circuit 10 caused by reducing supply voltage to the region 28, in accordance with an embodiment of the present disclosure. The system 100 may include clock routing components 102, including clock spines 104 and multiplexers 106, which receive and send clock signals from and to other portions, including other regions, of the integrated circuit 10.

As illustrated, the regional control circuit 42 of the region 28 may couple to a clock spine 104 to receive and send one or more clock signals. The regional control circuit 42 may also couple to a delay select component 108 to adjust delay of configurable delay lines 110 such that delays across regions in the integrated circuit 10 are approximately matched. For example, if the region 28 includes one or more paths of a design programmed in the region 28 with less critical logic (e.g., with a criticality value less than 1), the regional control circuit 42 may reduce voltage supplied to the region 28, thus increasing clock delay in the region 28. In response, the regional control circuit 42 may send a signal to the delay select component 108 to decrease delay in the configurable delay lines 110, compensating for the increased clock delay. The delay select component 108 may be implemented in the form of one or more multiplexing components (e.g., a multiplexer), one or more routing components, and the like. In this manner, clock skew across multiple regions of the integrated circuit 10 may be reduced.

Figure 7:
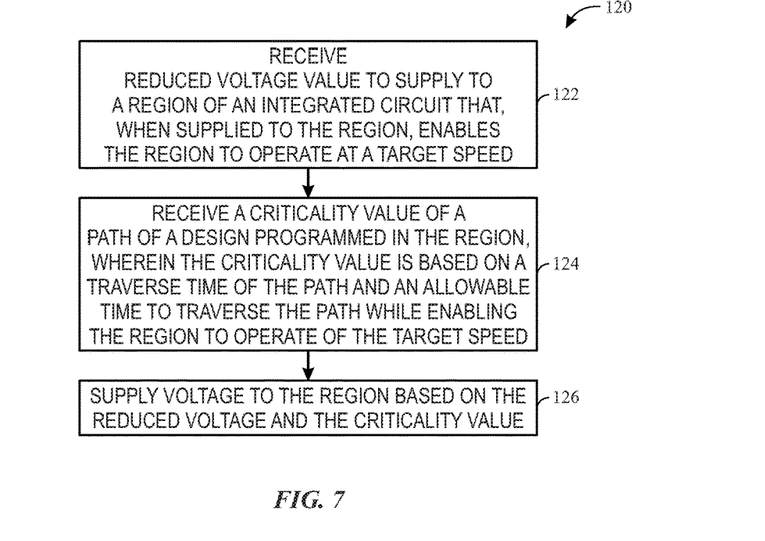
FIG. 7 is a flow diagram of a method for reducing voltage supplied to a region of the integrated circuit 10 of FIG. 2 based on speed of the region and a design programmed in the region, in accordance with an embodiment of the present disclosure.

FIG. 7 is a flow diagram of a method 120 for reducing voltage supplied to a region (e.g., 28) of the integrated circuit 10 of FIG. 2 based on speed of the region 28 and a design programmed in the region 28, in accordance with an embodiment of the present disclosure. The method 120 may be performed by any suitable device or combination of devices that may determine speed of the region 28, determine criticality of the design, and/or control the power regulator 36 supplying voltage to the region 28. While the method 120 is described using steps in a specific sequence, it should be understood that the present disclosure contemplates that the describe steps may be performed in different sequences than the sequence illustrated, and certain described steps may be skipped or not performed altogether. In some embodiments, at least some of the steps of the method 120 may be implemented by a regional control circuit of the integrated circuit 10, such as the regional control circuit 42. In alternative or additional embodiments, at least some steps of the method 120 may be implemented by design software that programs the integrated circuit 10, such as the design software 4 that programs the integrated circuit using a program 8 (bitstream).

The regional control circuit 42 may receive (block 122) a reduced voltage value to supply to the region 28 of the integrated circuit 10 that, when supplied to the region 28, enables the region 28 to operate approximately at or above a target speed. In some embodiments, the design software 4 may determine the reduced voltage value. That is, the design software 4 may determine a nominal voltage to supply to at least some regions of the integrated circuit 10 to operate approximately at or above the target speed. However, each region may include different components, different routing, or simply fluctuations that cause each region to operate differently. As such, the design software 4 may determine reduced voltage values to supply to each region to operate approximately at or above the target speed, where each reduced voltage value for each region may be different. The design software 4 may send a reduced voltage value to the regional control circuit 42 and/or store the reduced voltage value in the non-volatile memory devices 44 of each region via a program 8 (bitstream).

The regional control circuit 42 may also receive (block 124) a criticality value of a path of the design programmed in the region 28. In some embodiments, the design software 4 may determine the criticality value. The criticality value may be based on a propagation time of the path (e.g., when the region is supplied with the reduced or nominal voltage) and an allowable time to traverse the path while enabling the region to operate approximately at or above the target speed. In some circumstances, the design may include multiple paths in the region 28. In such circumstances, the design software 4 may determine the criticality values of each path in the region 28. The design software 4 may send a criticality value or values to the regional control circuit 42 and/or store the criticality value or values in the random access memory device 46 of each region via a program 8 (bitstream).

The regional control circuit 42 may supply (block 126) voltage to the region 28 based on the reduced voltage value and the criticality value. For example, the regional control circuit 42 may instruct the power regulator 36 to supply a voltage $V_{DD}$ 38 that is a product of the reduced voltage value stored in the non-volatile memory devices 44 and the criticality value stored in the random access memory device 46. In this manner, power consumption of the region 28 may be reduced beyond that which is determined based on the speed of the region without considering the design (e.g., a user design) in the region 28, while still approximately meeting a target speed of the region 28.

In circumstances where there are multiple paths in the region 28, the design software 4 may determine a criticality value of each path and store a set of criticality values in the random access memory device 46 via a program 8 (bitstream). The regional control circuit 42 may then supply voltage to the region 28 based on the reduced voltage value and the highest criticality value of the multiple paths. In some embodiments, the regional control circuit or regional control circuits may send multiple control signals to multiple power regulators to supply the region with multiple supply voltages. In such embodiments, at least some of the multiple supply voltages may be based on criticality values of the multiple paths. In this manner, power consumption of the region 28 may be reduced even further by tailoring voltage supplied by the multiple power regulators to criticality values of the multiple paths of the design programmed in the region 28. In additional or alternative embodiments, at least some of the multiple supply voltages may be based on criticality values of fixed delay ratios. In this manner, power consumption of the region 28 may be reduced by providing fixed delay ratio cutoffs to reduce voltage supplied to the multiple paths of the design programmed in the region 28.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit comprising:
a plurality of regions, wherein at least one region of the plurality of regions comprises a control circuit, wherein the control circuit is configured to:
receive a target voltage value to supply to the region that, when supplied to the region, enables the region to operate approximately at or above a target speed;
receive a first criticality value of a first path of a design programmed in the region, wherein the first criticality value is based on a first propagation time of the first path and a first allowable time to traverse the first path while enabling the region to operate approximately at or above the target speed; and
instruct a power regulator to supply voltage to the region based at least in part on the target voltage value and the first criticality value; and
the power regulator communicatively coupled to the at least one region, wherein the power regulator is configured to supply power to the at least one region.

2. The integrated circuit of claim 1, wherein each region of the plurality of regions comprises:
a plurality of logic blocks; and
programmable interconnect fabric coupling the plurality of logic blocks together.

3. The integrated circuit of claim 1, comprising a field programmable gate array device.

4. The integrated circuit of claim 1, comprising a first memory communicatively coupled to the control circuit, wherein the first memory stores the target voltage value.

5. The integrated circuit of claim 4, wherein the first memory is non-volatile.

6. The integrated circuit of claim 1, comprising a second memory communicatively coupled to the control circuit, wherein the second memory stores the first criticality value.

7. The integrated circuit of claim 6, wherein the second memory comprises a random access memory.

8. The integrated circuit of claim 1, wherein the control circuit is configured to instruct the power regulator to supply voltage to the at least one region based at least in part on a temperature of the integrated circuit, an age of the integrated circuit, or an operating lifetime of the integrated circuit.

9. The integrated circuit of claim 1, wherein the design includes a plurality of paths in the region, including the first path.

10. The integrated circuit of claim 9, wherein the first criticality value is the highest criticality value of the plurality of paths in the region.

11. The integrated circuit of claim 10, wherein the control circuit is configured to receive a second criticality value of a second path of the plurality of paths, wherein the second criticality value is based on a second propagation time of the second path and a second allowable time to traverse the second path while enabling the region to operate approximately at or above the target speed.

12. The integrated circuit of claim 11, wherein the control circuit is configured to instruct the power regulator to supply a second voltage to the region based at least in part on the target voltage value and the second criticality value or based at least in part on the target voltage value and a fixed delay ratio.

13. An integrated circuit comprising:
a plurality of regions, wherein at least one region of the plurality of regions comprises:
a control circuit configured to control a first power regulator;
a non-volatile memory device communicatively coupled to the control circuit, wherein the non-volatile memory device is configured to store a target voltage value to supply to the at least one region that, when supplied to the at least one region, enables the at least one region to operate approximately at or above a target speed; and
a random access memory device communicatively coupled to the control circuit, wherein the random access memory device is configured to store a first criticality value of a first path of a design programmed in the at least one region, wherein the first criticality value is based on a propagation time of the first path and an allowable time to traverse the first path while enabling the at least one region to operate approximately at or above the target speed;
wherein the control circuit is configured to instruct the first power regulator to supply a first voltage to the at least one region based at least in part on the target voltage value and the first criticality value; and
the first power regulator communicatively coupled to the at least one region, wherein the first power regulator is configured to supply power to the at least one region.

14. The integrated circuit of claim 13, wherein the at least one region comprises a plurality of delay lines and a multiplexer coupled to the plurality of delay lines.

15. The integrated circuit of claim 14, wherein the control circuit is configured to adjust delay of the plurality of delay lines such that delays across the plurality of regions approximately match.

16. The integrated circuit of claim 13, wherein the integrated circuit comprises a second power regulator communicatively coupled to the at least one region, wherein the second power regulator is configured to supply power to the at least one region.

17. The integrated circuit of claim 16, wherein the random access memory device is configured to store a second criticality value of a second path of the design programmed in the at least one region, wherein the second criticality value is based on a propagation time of the second path and an allowable time to traverse the second path while enabling the at least one region to operate approximately at or above the target speed.

18. The integrated circuit of claim 17, wherein the control circuit is configured to instruct the second power regulator to supply a second voltage to the at least one region based at least in part on the target voltage value and the second criticality value.

19. The integrated circuit of claim 16, wherein the control circuit is configured to instruct the second power regulator to supply voltage to the at least one region based at least in part on the target voltage value and a fixed delay ratio.

20. One or more tangible, non-transitory, machine-readable media comprising instructions configured to cause a control circuit of an integrated circuit to:
supply a target voltage value to a region of the integrated circuit that, when supplied to the region, enables the region to operate approximately at or above a target speed;
receive a first criticality value of a first path of a design programmed in the region, wherein the first criticality value is based on a first propagation time of the first path and a first allowable time to traverse the first path while enabling the region to operate approximately at or above the target speed; and
instruct a power regulator coupled to the region to supply voltage to the region based at least in part on the target voltage value and the first criticality value.

* * * * *